United States Patent
Lipp et al.

(10) Patent No.: US 10,548,245 B2
(45) Date of Patent: Jan. 28, 2020

(54) LIQUID COOLED OPEN COMPUTE PROJECT RACK INSERT

(71) Applicants: Robert J Lipp, Los Gatos, CA (US); Phillip N Hughes, Menlo Park, CA (US)

(72) Inventors: Robert J Lipp, Los Gatos, CA (US); Phillip N Hughes, Menlo Park, CA (US)

(*) Notice: Subject to any disclaimer, the term of this patent is extended or adjusted under 35 U.S.C. 154(b) by 16 days.

(21) Appl. No.: 15/894,657

(22) Filed: Feb. 12, 2018

(65) Prior Publication Data

US 2019/0254199 A1 Aug. 15, 2019

(51) Int. Cl.
*H05K 7/20* (2006.01)
*H05K 7/14* (2006.01)

(52) U.S. Cl.
CPC ....... *H05K 7/20772* (2013.01); *H05K 7/1489* (2013.01); *H05K 7/20781* (2013.01); *H05K 7/20836* (2013.01); *H05K 7/20254* (2013.01)

(58) Field of Classification Search
CPC ............. H05K 7/20772; H05K 7/1489; H05K 7/20836; H05K 7/20254
USPC ........................................................ 361/702
See application file for complete search history.

(56) References Cited

U.S. PATENT DOCUMENTS

| | | | |
|---|---|---|---|
| 4,733,720 A | 3/1988 | Havranek et al. | |
| 6,393,853 B1 | 5/2002 | Vukovic et al. | |
| 6,835,598 B2* | 12/2004 | Baek | H01L 25/105 257/686 |
| 7,012,807 B2* | 3/2006 | Chu | G06F 1/20 165/104.33 |
| 7,167,366 B2 | 1/2007 | Cheon | |
| 7,212,409 B1 | 5/2007 | Belady et al. | |
| 7,218,129 B2 | 5/2007 | Beaman et al. | |
| 7,312,987 B1 | 12/2007 | Konshak | |
| 7,336,493 B2 | 2/2008 | Berkenbush et al. | |
| 7,403,384 B2* | 7/2008 | Pflueger | H05K 7/20545 165/104.21 |
| 7,403,393 B2 | 7/2008 | Herring et al. | |
| 7,552,758 B2 | 6/2009 | Garner et al. | |
| 7,595,988 B2 | 9/2009 | Wilson et al. | |
| 7,626,820 B1* | 12/2009 | Konshak | H05K 7/20672 165/104.33 |
| 7,898,808 B2* | 3/2011 | Joiner | H05K 7/20445 361/704 |
| 7,974,098 B2* | 7/2011 | Oki | G02B 6/4201 165/185 |
| 8,432,692 B2 | 4/2013 | Peng et al. | |
| 8,681,497 B2 | 3/2014 | Lee | |
| 8,755,179 B2 | 6/2014 | Alyaser et al. | |
| 8,789,578 B2 | 7/2014 | Asakura | |
| 8,804,337 B2 | 8/2014 | Zaffetti et al. | |
| 8,879,268 B2* | 11/2014 | Lee | H05K 7/20445 361/704 |
| 8,913,391 B2 | 12/2014 | Ling et al. | |
| 2003/0051860 A1* | 3/2003 | Montgomery | F28D 15/043 165/46 |

* cited by examiner

Primary Examiner — Anatoly Vortman

(57) ABSTRACT

A system and an method to provide cooling of electronic components mounted in a tray by means of a cold plate, is disclosed. The system comprises a cold plate that is mounted in a rack with removable trays mounted on rails affixed to the underside of the cold plate. In one embodiment, compatibility with Open Rack specifications developed by the Open Compute Project is disclosed.

16 Claims, 9 Drawing Sheets

OCP Rack With 12 OU Inserts

Tray Shelf Assembly

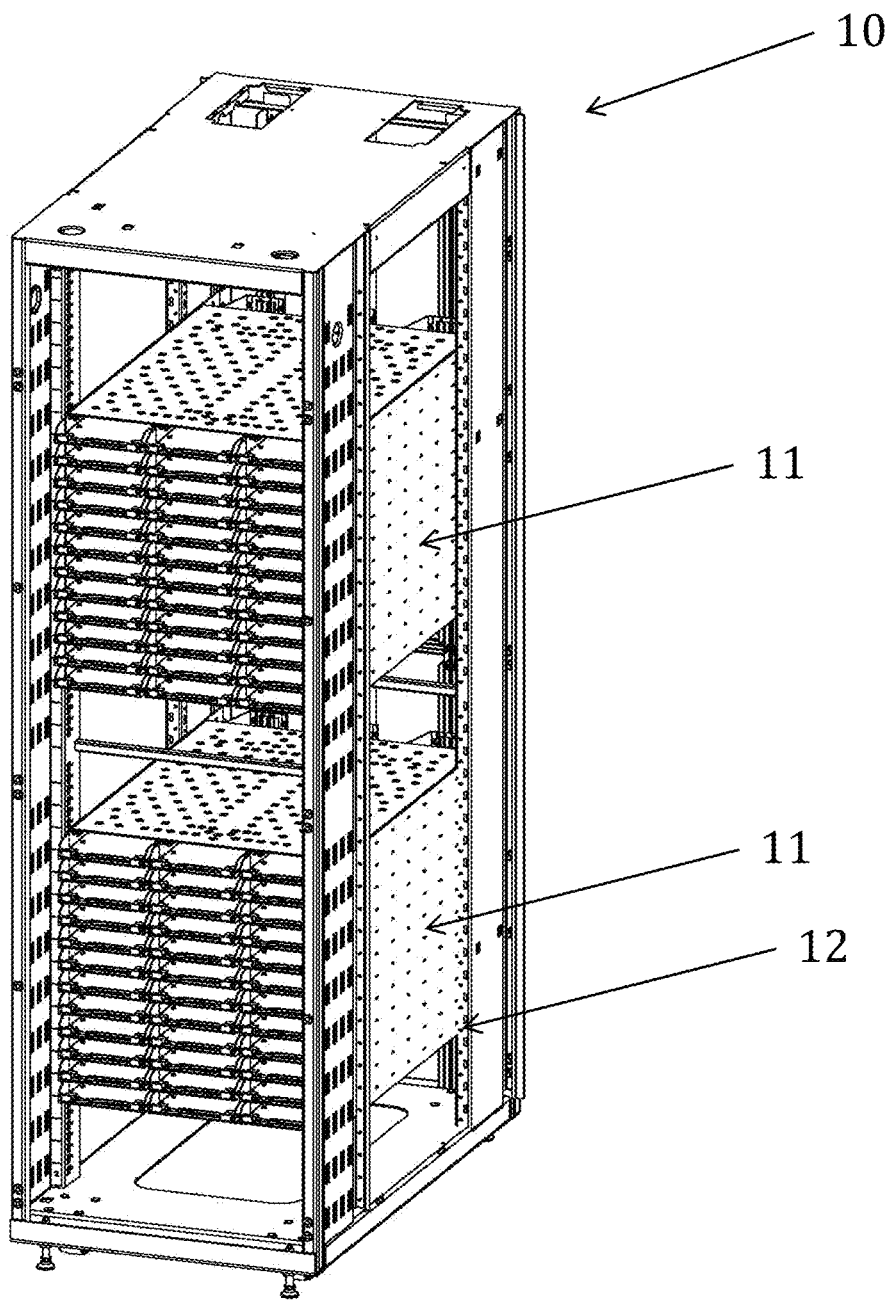
FIG. 1 OCP Rack With 12 OU Inserts

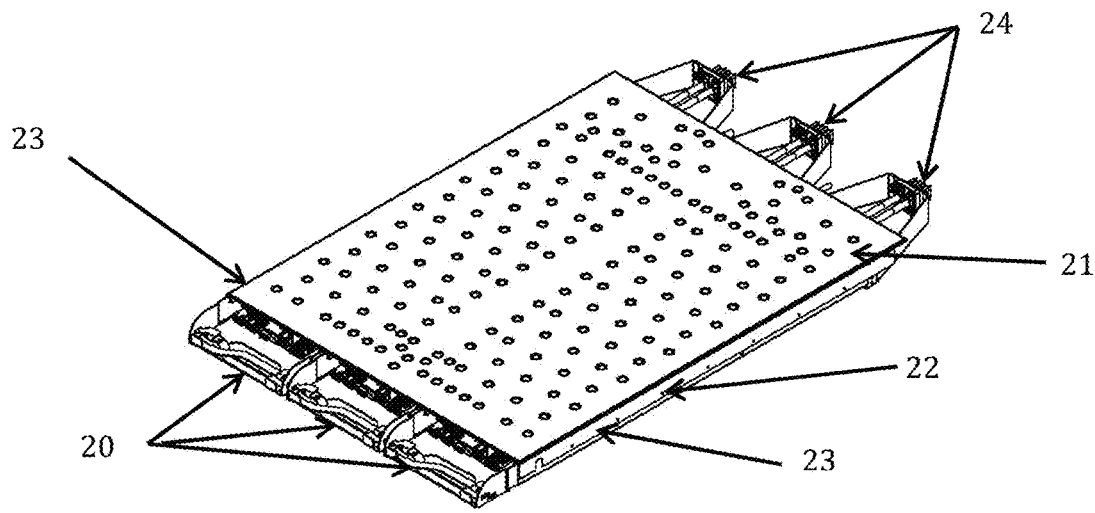
FIG. 2 Tray Shelf Assembly
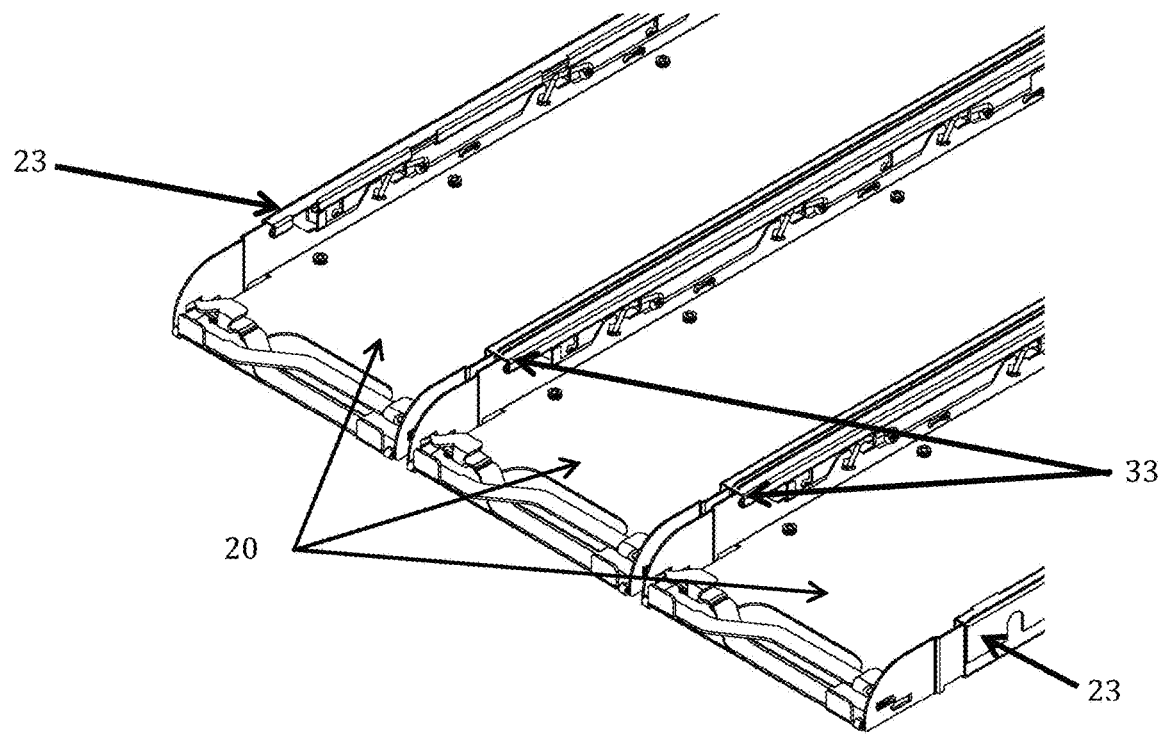
FIG. 3 Tray Shelf Assembly with Transparent Cold Plate

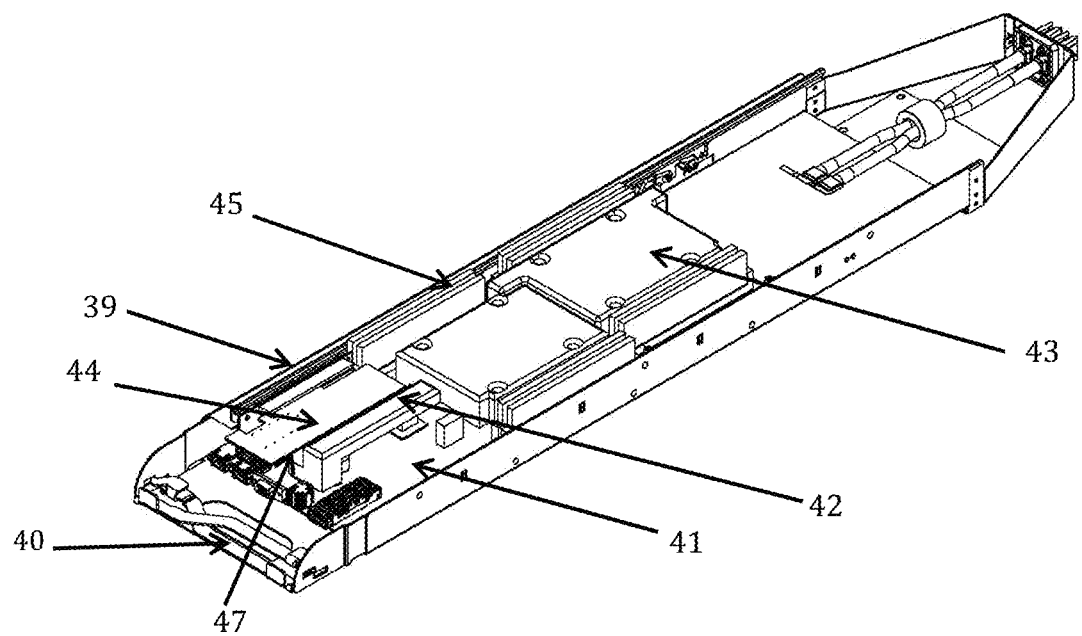
FIG. 4 Full Tray Assembly (Closed)
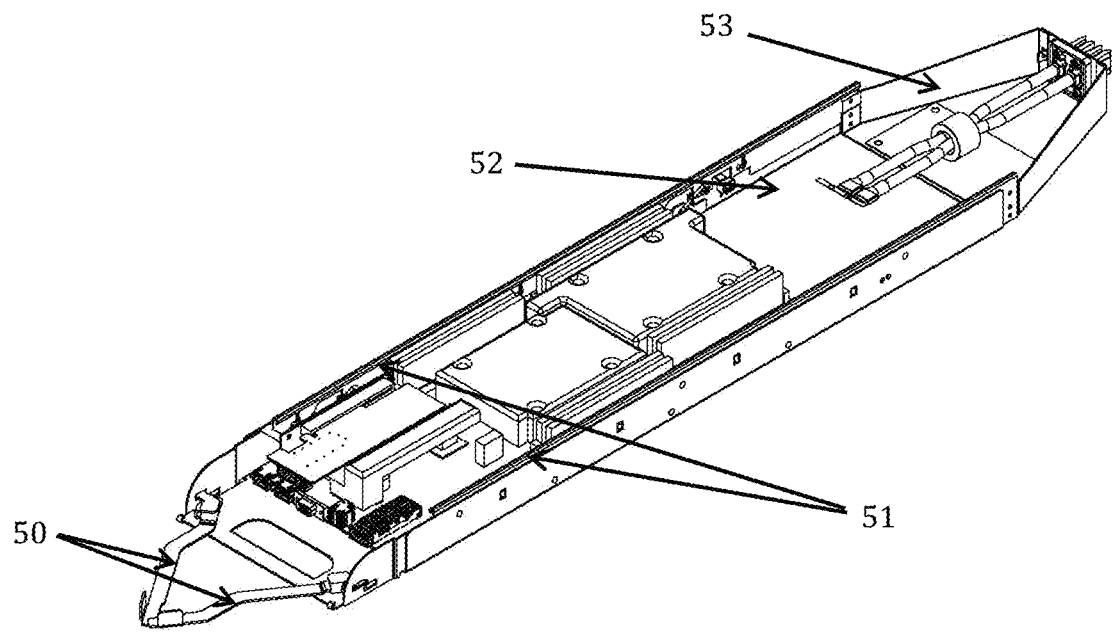
FIG. 5 Full Tray Assembly (Open)

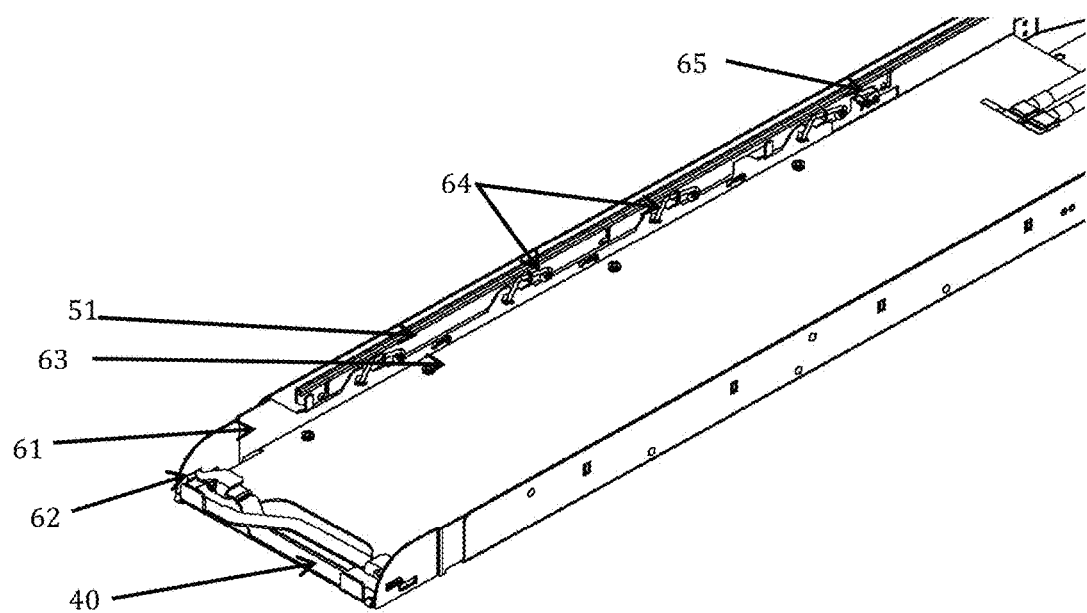
FIG. 6 Empty Tray Assembly
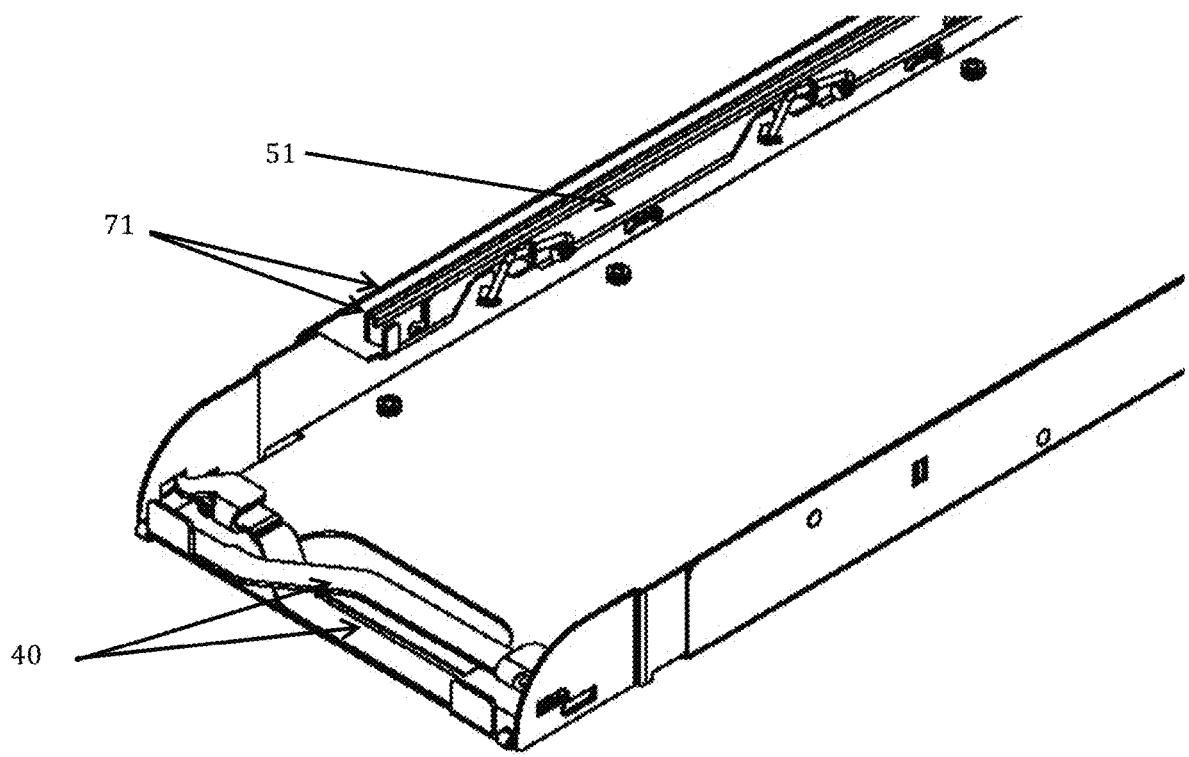
FIG. 7 Tray Assembly Showing Sliders Closed

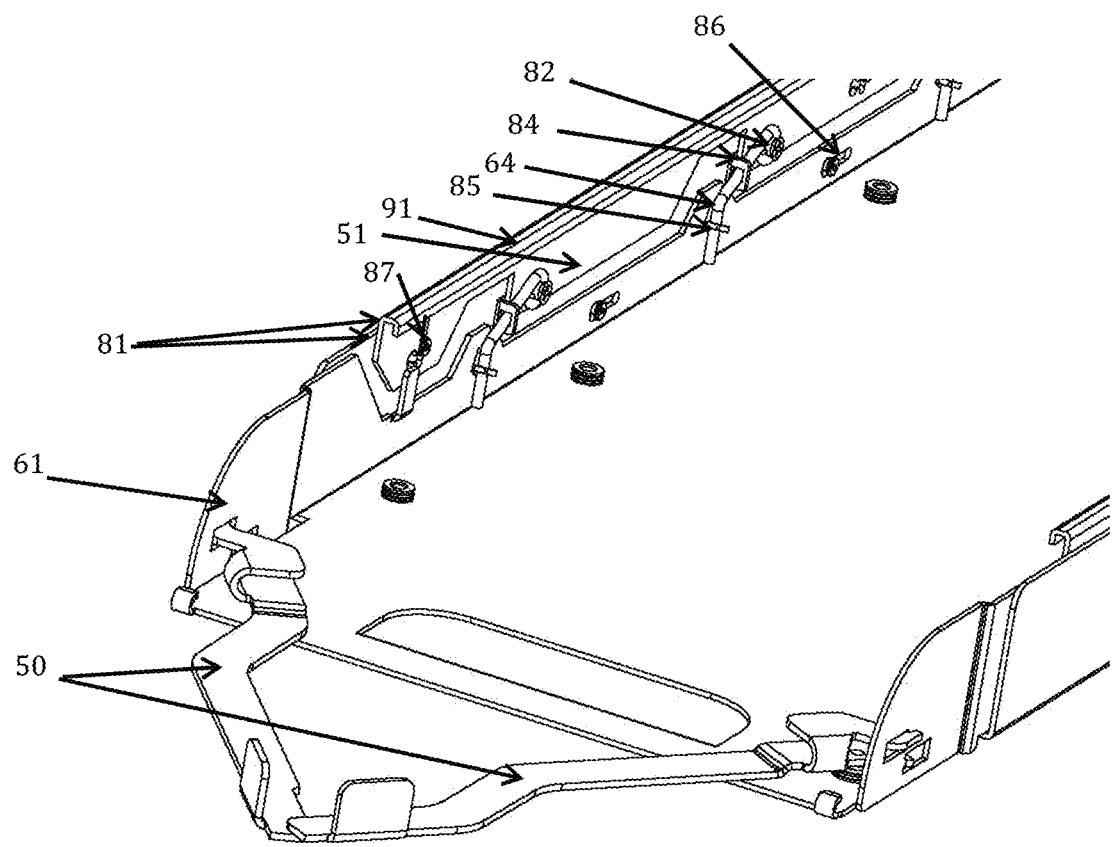
FIG. 8 Closeup of Tray Assembly (Open)
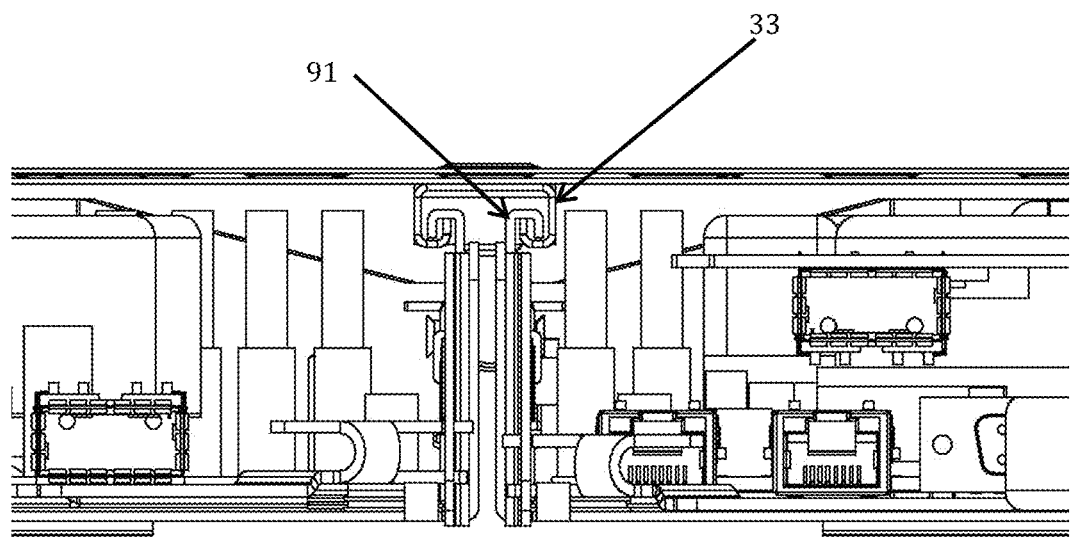
FIG. 9 Tray Assembly Shelf Rail Closeup

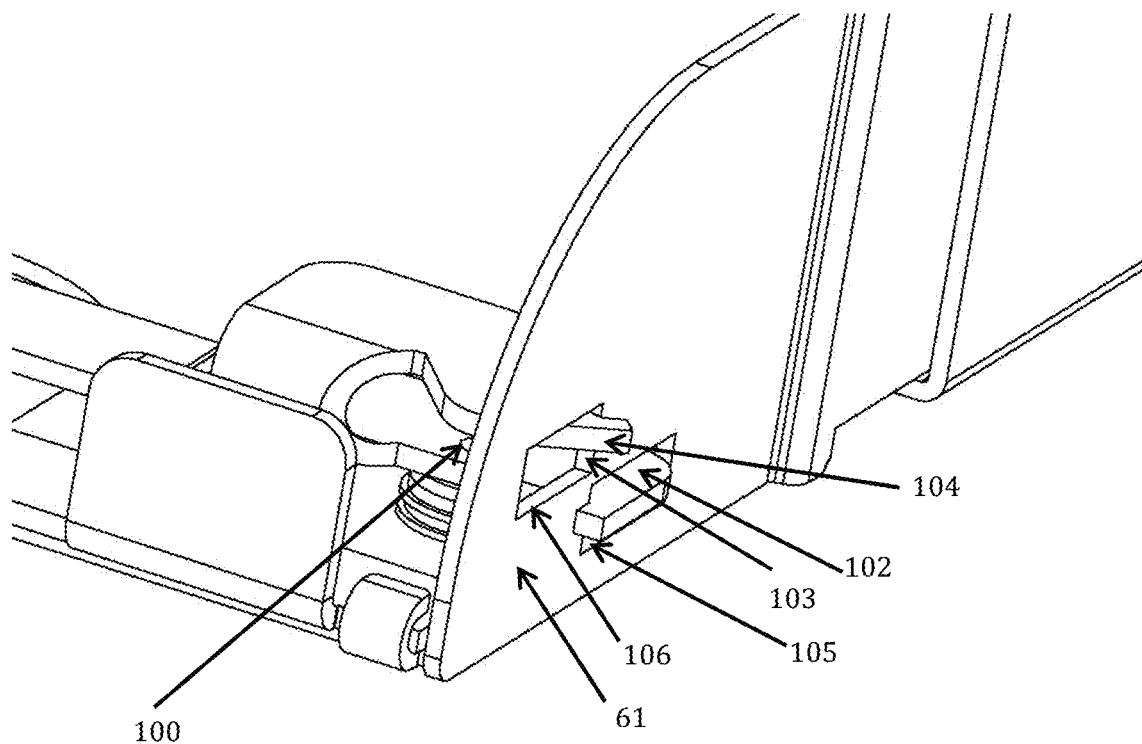
FIG. 10 Dual Engagement Lever Closeup
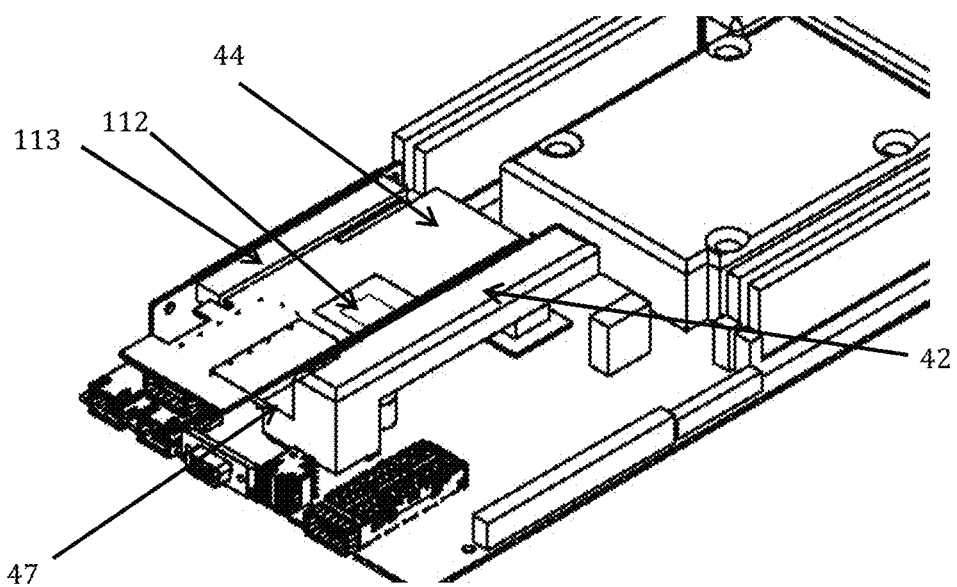
FIG. 11 Board Assembly With PCI Riser

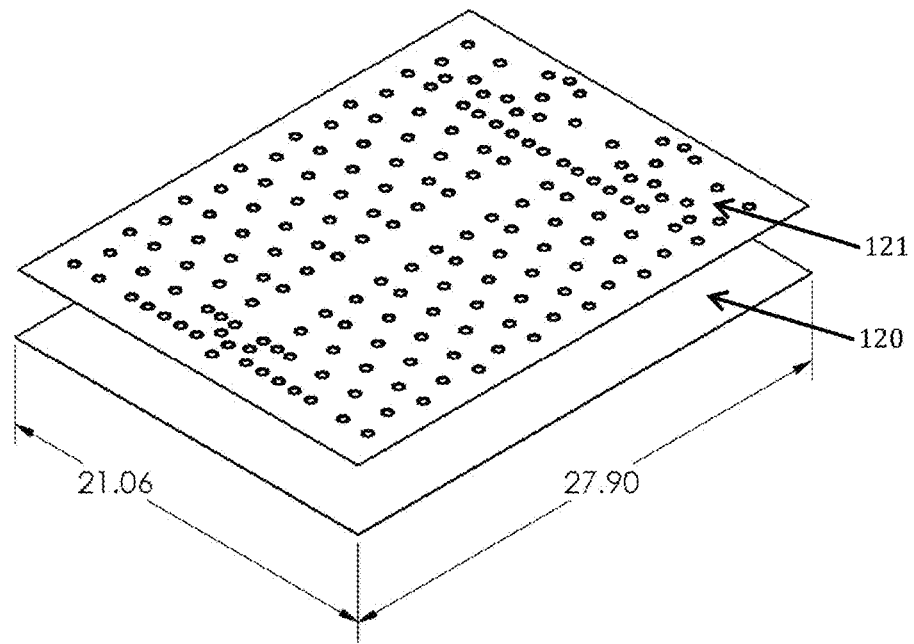
FIG. 12 Exploded View of Cold Plate
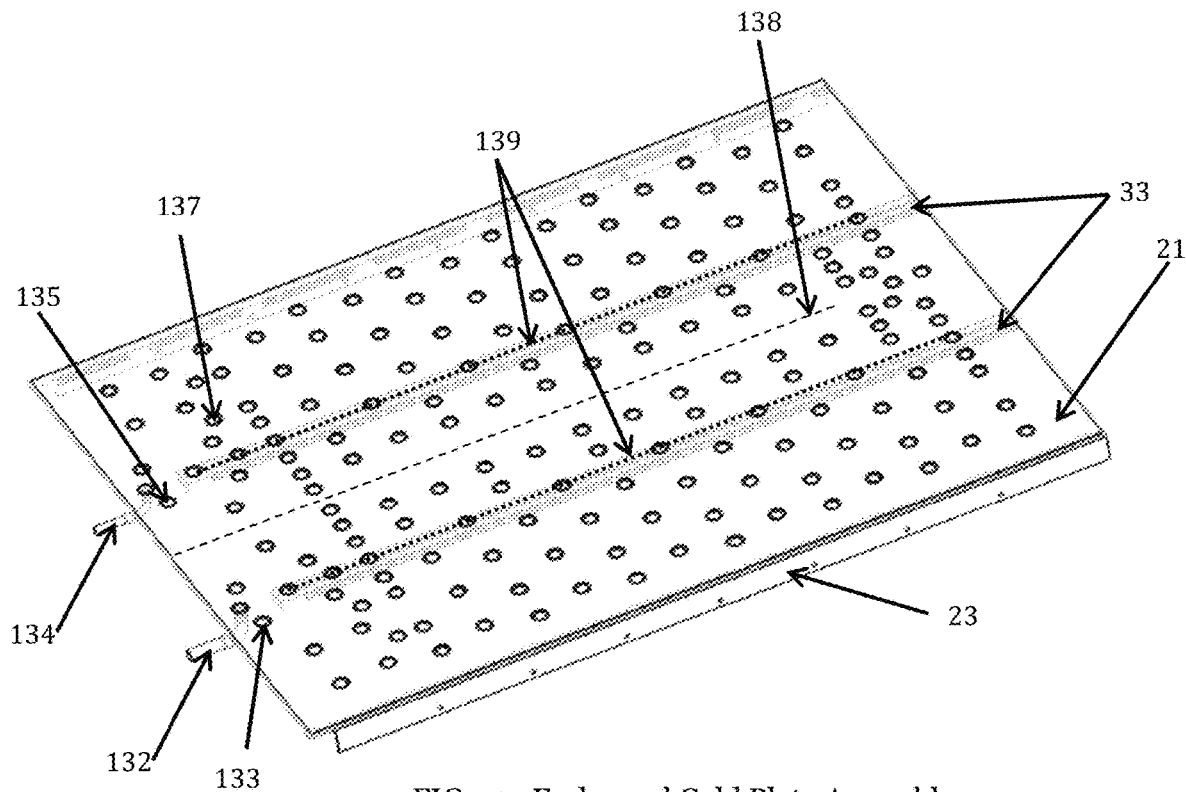
FIG. 13 Embossed Cold Plate Assembly

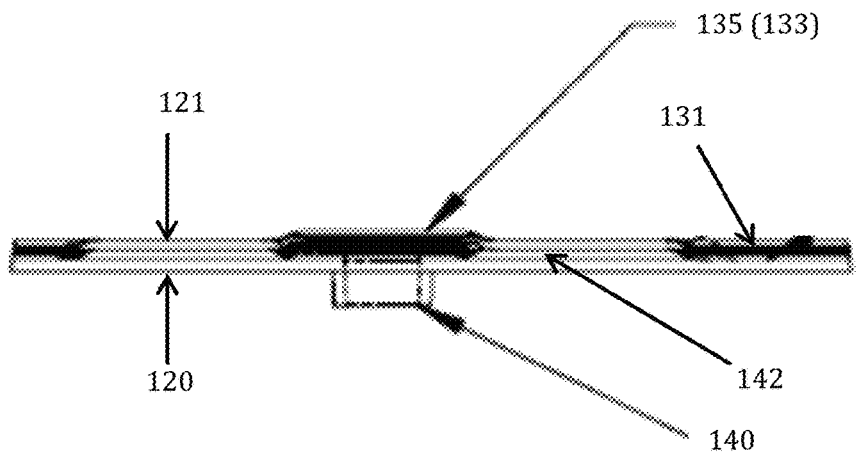
FIG. 14A Detailed View of Plate Assembly and I/O Lances
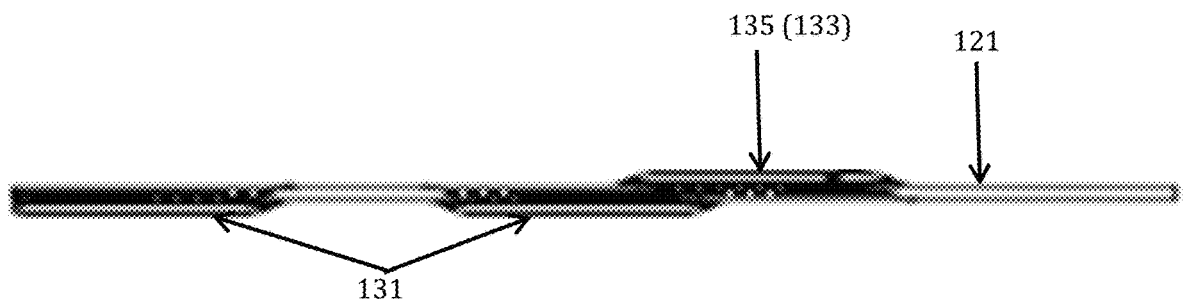
FIG. 14B Detailed Side View of Embosses on Top Plate

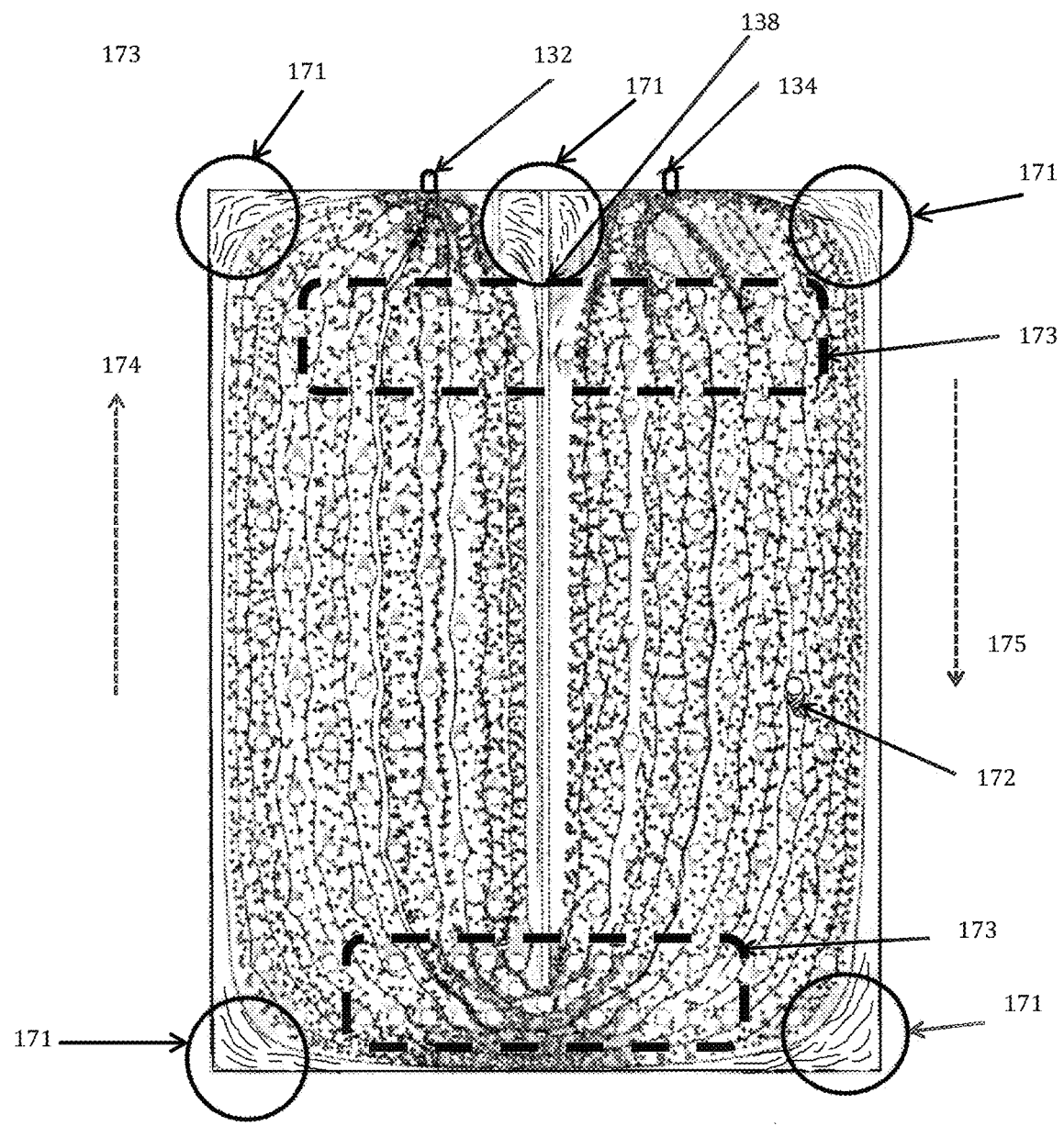
FIG. 15 Simulated Fluid Flow

LIQUID COOLED OPEN COMPUTE PROJECT RACK INSERT

CROSS-REFERENCE TO RELATED APPLICATIONS

This application claims priority benefit of U.S. Provisional Application No. 62/548,595 entitled "A Liquid Cooled Open Compute Project Rack Insert", filed on 22 Aug. 2017, which is hereby incorporated in its entirety by reference.

TECHNICAL FIELD

The present application relates generally to the cooling of electronic systems such as compute and storage systems by the use of cold plates; and, in a specific exemplary embodiment, to a system and method for cooling such equipment modularly deployed in an "Open Compute Project" rack.

BACKGROUND OF THE INVENTION

Enterprise-based compute and storage systems are increasingly deployed as modular systems with standardized form factor electronic enclosure modules mounted in standardized support structures. Standardized electronic enclosure modules can be devoted to perform any of a number of different functions such as computing, storage, or networking. The enclosure modules have been commonly mounted in standardized support structures such as 19 inch (approximately 0.482 m) or 24 inch (approximately 0.610 m) wide racks and a "1 U" vertical slot spacing of 1.75 inch (approximately 44.5 mm). Within this document, such enclosures may be referred to as trays, servers or server trays for clarity of example, and such references are not meant to limit the scope of this disclosure.

More recently, a new standards' organization called the "Open Compute Project" (OCP) has been formed to promote a new rack standard called the "Open Rack". As described on their website http://www.opencompute.org OCP is a collaborative community focused on redesigning hardware technology to efficiently support the growing demands on compute infrastructure". The "Open Rack" is further described and mechanically defined by http://www.open-compute.org/wiki/Open_Rack.

Key attributes of the "Open Rack" are a 600 mm exterior width, a 540 mm interior width and a "1 OU" vertical mounting slot spacing of 48 mm, at which slot spacing support shelves can be optionally installed. These shelves support modular electronic enclosures, or trays, that can be slid in atop them. Racks are made with a number of different heights (e.g. 42 OU and 48 OU). Air cooled servers comprise trays typically 174 mm wide and 2 OU (96 mm) high. Typically, shelves are installed at a 2 OU spacing in a rack and server trays slid in atop them, three across. On the back of the rack are vertically mounted bus bars that distribute power to the trays. A power connector on the back of the tray engages the power bus bars when the tray is fully inserted in the rack.

Open Racks are typically air-cooled, often necessitating 2 OU vertical tray spacing to allow sufficient cooling air to flow through. The enclosures draw air in from the room in which they are housed by means of fans that accelerate the air and force it over the enclosure's internal components, thus cooling the components. The resulting heated air is exhausted back into the room. The room air itself is cooled by chillers or other means.

The inventors of this patent have previously developed cold plate means to cool conventional servers and blades and have been awarded U.S. Pat. No. 8,000,103 "COOLING SYSTEM FOR CONTACT COOLED ELECTRONIC MODULES" and U.S. Pat. No. 8,270,170 "CONTACT COOLED ELECTRONIC ENCLOSURE" that are included herein by reference.

The above patented inventions are limited in that they do not disclose how to make a structurally strong and low flexibility cold plate structure that can support an electronic module mounted below it, nor how to fit multiple modules onto such a structure. Furthermore, the means previously described will not fit into a conventional standard rack, such as the common 19" rack using conventional sized modules and components. Without the ability to adopt and use such common standard components and maintaining the footprint and density of existing standard racks, the marketplace adoption of such invention is hampered. Furthermore, the several methods described use relatively high friction means of engagement, such as diagonal slits, to (orthogonally) redirect operating forces, limiting their ease of use. Lastly, it is important that a well defined pressure be applied to the conformable Thermal Interface (TIM) over the product lifetime, and over what is a poorly regulated distance of engagement travel. These earlier means depend on poorly defined and controlled component and system characteristics, such as a flexible plate and enclosure, to develop and control these pressures.

This invention details specific means and methods to overcome such limitations by, improving and extending them, and ensuring compatibility with the Open Rack standard.

BRIEF SUMMARY OF THE INVENTION

This invention describes a method and means to adapt cold plate based liquid cooling technology to the Open Rack. Liquid cooling brings the advantages of being able to cool higher power electronic enclosures than air cooling while improving energy efficiency. It also permits building a denser system, typically twice that of air cooled. While this invention describes a water based cold plate technology, other liquids such as refrigerant may be used with appropriate changes in cold plate design and/or materials.

This invention eliminates the above mentioned shelf which is affixed at the base of the mounting slot and that supports the server trays in an Open Rack. It replaces it with a an integrated cold plate shelf optimized for performance and heat transfer affixed at the top of the slot from which server trays are suspended. The entire integrated shelf is a thin strong structurally supportive cold plate comprising a strong and corrosion resistant material such as stainless steel to which mounting rails are attached on the bottom side. These rails are structures that mate or couple with and support the trays such that the trays can be slid in and out of the rack under the cold plate. The term rails is used herein as a general term to describe any such structures that mate or couple with and support such trays.

Similarly to conventional OCP trays, these trays are typically installed three across and engage the power distribution bus bars at the rear of the supporting rack. Similar in size to OCP trays, motherboards suitable for the OCP trays can be mounted in these trays. These trays can also be used in non OCP compatible racks or other structures, and may use a different power distribution scheme.

BRIEF DESCRIPTION OF DRAWINGS

Deleted

FIG. 1 is an illustration of an Open Rack with an exemplary embodiment of two 12 OU Inserts mounted therein;

FIG. 2 is a Server Tray Shelf Assembly illustration of an exemplary embodiment showing three trays mounted under a cold plate;

FIG. 3 is a cropped view of the Server Tray Shelf Assembly of FIG. 2 with the cold plate illustration transparent to expose for view the trays below it;

FIG. 4 is a Full Tray Assembly of an exemplary embodiment with the engagement levers in the Closed position;

FIG. 5 is a Full Tray Assembly of an exemplary embodiment with the engagement levers in the Open position;

FIG. 6 is a partial view of an Empty Tray Assembly of an exemplary embodiment with the operating mechanisms visible;

FIG. 7 is a partial view of an Empty Tray Assembly of an exemplary embodiment with the Slider Mechanism in the closed position;

FIG. 8 is a partial view closeup of an Open Tray Assembly of an exemplary embodiment;

FIG. 9 is a partial view closeup exemplary embodiment of a Tray Assembly Shelf Rail;

FIG. 10 is a closeup of an exemplary embodiment of the Dual Engagement Lever;

FIG. 11 is an example of a PC Motherboard Assembly with a horizontally mounted daughter card installed;

FIG. 12 is an exploded view of an exemplary embodiment mechanical drawing of the Cold Plate exemplary embodiment;

FIG. 13 is an exemplary embodiment of the Embossed Cold Plate Assembly with the Cold Plate shown partially transparent to reveal the underside details;

FIG. 14A is a partial side view of the Cold Plate exemplary embodiment showing details of the top and bottom plate assembly and input (output) lances;

FIG. 14B is a side partial view of the Cold Plate Top exemplary embodiment showing further emboss detail;

FIG. 15 is a plot of the fluid flow through the Cold Plate of the exemplary embodiment.

OVERVIEW

As used herein, the term "or" may be construed in an inclusive or exclusive sense. Similarly, the term "exemplary" may be construed merely to mean an example of something or an exemplar and not necessarily a preferred means of accomplishing a goal. Thus, any type of thermal cooling application is considered as being within a scope of the present invention.

The description that follows includes illustrative systems, methods, and techniques that cover exemplary embodiments defined by various aspects of the present disclosure. In the following description, for purposes of explanation, numerous specific details are set forth in order to provide an understanding of various embodiments of the inventive subject matter. It will be evident, however, to those skilled in the art that embodiments of the inventive subject matter may be practiced without these specific details.

DETAILED DESCRIPTION OF THE INVENTION

The drawings and descriptions below generally refer to an exemplary embodiment and should not be construed as a limitation to the invention disclosed herein.

As described in the above referenced patents, all high heat generating electronic components to be cooled have heat risers mounted on them that bring the heat to an approximately common plane and spread it out to a larger area as defined by the heat riser top area. A conformable Thermal Interface Material (TIM) is optionally placed on top of the heat risers. In this optional embodiment, to assure the TIM does not move and remains in the optimal position during tray installation, the TIM is affixed to one or more heat risers by repositionable adhesive tape. This tape is applied only to small areas such that it has minimal effect on heat transfer. After the server tray with the TIM installed is slid into the rack, one or more levers on the front of the tray are operated to raise the server tray (Closed position) such that the TIM is pressed in close contact to the cold plate, thermally coupling the components to be directly cooled to the cold plate, enabling heat to flow from the components, through heat risers, through the TIM to the cold plate. This closed position is sensed by a switch that permits power to flow into the high heat generating components only after the cold plate is thermally coupled to the tray components. As the rear power connector is mated to the bus bars prior to raising the tray, it is mounted on a floating platform section that, although mechanically attached to the main section of the tray, allows the main section to move vertically without moving the floating platform section containing the connector that is mated to the bus bars. The connector is connected via flexible cables to the main section of the tray. Although in this embodiment, the connector is mounted on a floating platform, it may be mounted on any structure that allows the main section of the tray on which the high heat components are mounted to move independently from that structure.

FIG. 1 shows a standard Open Rack 10 with two exemplary embodiment "12 OU" liquid cooled inserts 11 mounted in it. Each insert comprises 12 shelves. Any number of cold plates may be stacked in an Open Rack up to its total vertical size. The insert shell is used as a mount for the cold plates, adapting the Open Rack mounting points to the cold plate mounting points 12 to provide a practical modular means to accomplish this task. The "12 OU" insert shell is used in the exemplary embodiment but it is readily possible to design smaller or larger inserts or design cold plates that will mount directly to the rack. The insert shell itself may be a full enclosure with a top and bottom or simply a cold plate mounting means further mounted in the Open Rack.

In the exemplary embodiment, the cold plates in each insert are pre-plumbed to simplify installation in the rack. In this exemplary "12 OU" embodiment, the cold plate inputs and outputs are each connected to a plumbing apparatus with separate input and output manifolds respectively. Fluid control means distribute and regulate the incoming cooling fluid via this plumbing apparatus. In this embodiment a flow control regulator is installed in the input manifold regulating the input flow to approximately 12 gallons per minute (GPM). The distribution of this 12 GPM flow is further regulated to approximately 1 GPM per plate by an input orifice on each plate further described below.

FIG. 2 illustrates a single cold plate 21 with three trays 20 mounted below it. Note the holes 22 on the near side mounting rails 23 that provide means to rivet or otherwise affix the rail to the insert shell. Connectors 24 at the rear of the trays engage the power bus bars (not shown) when the trays are inserted into the rack.

FIG. 3 is an enlarged cropped view of the tray shelf assembly with the cold plate made transparent for viewing the underlying construction. Trays 20 are removable and slide into the rack on rails 23 33 mounted under the cold plate.

FIG. 4 is a tray in isolation with the levers set in the "Closed" position 40. By "Closed" we mean the levers are positioned such that the tray is lifted up and thermally coupled to the cold plate for cooling. Certain components such as the power interface hardware and TIM material are not illustrated. An electronic motherboard 41 is mounted in the tray. Note the heat risers 42 43 45 mounted on the motherboard components that bring the heat to a common plane so they can thermally couple with the cold plate via the TIM.

The multi-use heat riser 42 is mounted on several chips that require cooling and provides support and cooling to a horizontally mounted daughter printed circuit (PC) card 44. A thermal material (thermal grease or pad) is mounted between the PC card 44 and the extension of the Multi-use Heat Riser 47 that extends under the card. A thermal pad is also mounted on top of the card (not shown). When the tray is lifted, the PC card 44 and its components are cooled via conduction to both the heat riser extension 47 on the bottom and the cold plate above. Note the PC card connector 39 is not structurally strong and would not normally be able to provide support sufficient to resist the pressure needed to provide for good heat transfer. However, with this construction, the PC card is clamped between the cold plate and the section of the Multi-use Heat Riser 47 under it, providing sufficient pressure.

FIG. 5 is a tray with the levers set in the "Open" position 50. With the levers in this position, Supporting Rails 51 are at their maximum height and thus the tray is positioned at its lowest position, ready to be inserted into the rack. The tray components, including the TIM cannot contact the cold plate. For the Open Rack application, the total height of the tray and cold plate must be less than 48 mm. When the tray is in its lowest position, the total vertical height of the tray and associated cold plate and rails of this exemplary embodiment is nominally 47.5 mm, leaving a nominal 0.5 mm clearance from the cold plate in the slot below. There is also a nominal 2 mm clearance above the heat risers, sufficient for the addition of 1.5 mm TIM to be installed on them.

After insertion, the levers are moved to the Closed position 40, lifting the front "Main Floating Section" 52 of the tray, minus the floating section 53, into thermal contact via the TIM with the cold plate.

FIG. 6 is an isometric view of the front side of an empty tray. Note how an Engagement Lever 40 engages the Sliding Lever Bar 61 at slot 62. The lever rotates creating a push-pull action that forces the Sliding Lever Bar 61 forward and back. The Sliding Lever Bar 61 engages a number of Support Springs 64. Pressure on these springs makes them try to rotate, but instead, bending them and providing a near frictionless upward force on the tray Support Rail 51. Note this system has several valuable attributes. A linear front-back motion is translated into an orthogonal vertical motion with very little frictional losses. The springs apply a substantially constant force over the range of expected tolerances. The TIM is a conformable, flowing over time with applied pressure. As the TIM flows, the distance from the heat risers to the cold plate is reduced. However, the pressure applied by the springs changes very little, providing good long term thermal contact. Single pole switch 65 is open when the tray is in the low position. When the tray rises, the switch mechanically engages the cold plate shelf and closes. This switch is used to control the power to the motherboard and other electronics, preventing excessive power to be drawn by the electronics until the cold plate is thermally coupled to them.

FIG. 7 Shows the server tray with the Engagement Levers 40 Closed. The tray Support Rails 51 are maximally lowered (distance between the ends of arrows 71), raising the tray. Note that the tray will not rise the full distance shown here. Once the TIM mechanically engages the cold plate, it will start to compress and flow, moving very little more. The springs will take up the difference, compressing the TIM against the cold plate with predetermined force.

FIG. 8 is a closeup of an Open 50 tray assembly. Note the Support Rail 51 is at its maximum height, maximally lowering the tray (difference between the arrow ends 81).

Spring 64 is one of six springs used to exert and control the pressure upon the TIM between the tray and cold plate when the tray is raised. The springs comprise simple unwound spring wire segments that align under the width of the fold 91 on the top of the Support Rail 51, assuring the springs are not the limit to motherboard width. Each spring applies a nominal 15 pounds of downward force on Support Rail 51 when Sliding Lever Bar 61 is pulled forward by closing Levers 50. The Sliding Lever Bar 61 is made from a simple thin sheet of sheet metal so it has excellent tension characteristics but will readily bend under compression. The large forces needed to compress the TIM are therefore exerted by pulling the Sliding Lever Bar forward, and releasing it by sliding the Sliding Lever Bar obackward in the tray. The Sliding Lever Bar 61 is constrained to a horizontal motion by multiple slot and pin configurations 86. The Support Rail 51 is constrained to a vertical motion by multiple slot and pin configurations 87. Each spring is attached to and freely rotates upon screw 82. Attachment means 84 and 85 are holes in extrusions on the tray and Sliding Lever Bar 61 components respectively through which the spring traverses. "Closing" the Sliding Lever Bar by pulling it forward by the Levers 50 provides torque to the spring, bending it. The difference between the spring position in this "Open" configuration and the unconstrained "Closed" configuration illustrated in FIG. 7 is clearly evident.

A key benefit of this embodiment is the redirection of the horizontal push-pull motion of the Sliding Lever Bar 61 into the predictable vertical motion and vertical force of the Support Rail 51 with very little friction by the bending of the springs. This embodiment can readily be modified with different attachment means, spring configuration and applied forces by one skilled in the art, and all such embodiments are claimed herein.

FIG. 9 is a close-up of the mating of a center slide rail with a tray edge. The sliding rail structure 33 is folded to provide a raised edge and slot that captures and supports a similar structure 91 on the Support Rail 51 top section. The trays can thus be slid in and out from under the cold plate along these rails. After the tray is inserted into the rack, it is raised up to be in intimate contact with the cold plate, compressing the TIM between the cold plate and heat risers. As discussed in the referenced patents, the TIM flows under pressure and conforms to both the heat risers and cold plate, assuring efficient heat transfer.

FIG. 10 is a closeup of an Engagement Lever engaging the Sliding Lever Bar 61. As the Engagement Lever rotates around the center of rotation 100, the distance from the center of rotation to where it engages the Sliding Lever Bar 61 changes. They are at their closest where the line from the center of rotation to the engagement point is perpendicular to the Sliding Lever Bar, moving farther away as the Sliding Lever Bar engagement point moves away from that position. Ideally, this distance is at its shortest when the maximum force is being applied to the Sliding Lever Bar from the Engagement Lever, i.e. the Closed position. Ideally, the point of engagement is the same for the end point of pulling (Closed) as that for the start of pushing (Open). Use of a single protrusion of the Engagement Lever into a slot on the sliding bar would force a horizontal offset in the point of contact, with either one, or both, of the push-pull actions occurring at different points, off the perpendicular from the axis of rotation. It would also require the protrusion to be longer, therefore extending out farther through the slot and possibly interfering with the adjacent tray mechanisms. This design uses a unique push-pull mechanism to align these actions to the same engagement radius point by having them operate in separate vertical planes at a common radius edge 103. The Engagement Lever is folded to create an Engagement Lever Top 104 and Engagement Lever Bottom 102 to provide these two actions on separate planes with two separate cuts with coincident vertical opposite edges (top cut 106 and bottom cut 105) in the Sliding Lever Bar 61.

FIG. 11 is a closeup of the Multi-use Heat Riser 42 with the PC card 44 shown semi-transparent. The PC card connector 113 is not mechanically strong in the vertical direction and cannot support the forces necessary to support contact cooling of the PC card to the cold plate. A section of the Multi-use Heat Riser 47 extends under the PC card, and in particular, under a chip 112 mounted on the underside of the PC card and needing cooling. A thermal conducting material is mounted between the chip and the heat riser (not shown). Another flexible TIM pad is placed on top of the card (not shown). Raising the tray sandwiches the PC card 44 and chip 112 between the heat riser extension 47 and cold plate, conducting the heat away.

FIG. 12 is a simple dimensioned and exploded view of the top 121 and the substantially flat bottom 120 sections of the assembled cold plate. The Open Rack compatible plate is approximately 21 inches by 28 inches in area. We use welding for joining the sections in this exemplary embodiment. However, this no way is meant to exclude or limit other joining methods such as gluing, all such methods which are hereby claimed as part of this invention. The upper and lower plate sections are welded or otherwise hermetically fixed together around the periphery. They are held a known distance apart by spacers, in this exemplary embodiment, such spacers are downward embosses in the top plate. In this exemplary embodiment, the edges of the cold plate are laser seam welded. They are also spot welded at every emboss. In this embodiment the input and output ports are on the same edge of the plate. The plate thus further includes an optional center weld barrier pattern between the input and output ports forcing the flow to traverse most of the plate. The more and greater number of welds the stronger the plate, and the higher the sustainable operating pressure. However, embosses and welds interfere with the fluid flow by blocking it at such places. A balance must be made. In this example, overall, considering the embosses, center barrier and edges, no place on the cold plate is further than 25 mm from the closest weld, i.e. all welding distances are no more than 50 mm apart, sufficiently close to guarantee a minimum 25 to 35 PSI operating pressure. Plate section thickness, material choice and operating pressure are tradeoffs necessary to consider in spacing these welds. Interdigitating welds over much of the interior area is an effective way to implement this welding feature and further promote fluid mixing for improved performance as further described below. The center barrier pattern is optional as it is possible in a different embodiment to design a cold plate with the input and output ports arranged differently such as on opposite sides, wherein no center barrier is required. Note that all these structures work in harmony to form the structural and coolant flow characteristics of the cold plate.

FIG. 13 Is a semi-transparent view of the full Cold Plate Assembly showing the entire emboss pattern (emboss 137 is a typical emboss) and rail attachment. The Inlet and Outlet Pipes 134 132 respectively are welded, soldered or otherwise affixed to the underside of the plate. Above the Inlet and Outlet Pipes are reverse embosses 135 133 that are raised up from the surface of the plate. They provide additional room for the liquid to spread out within the plate before traversing it. The inlet flow is restricted by the size of the inlet hole cut into the plate (not shown). This inlet hole acts as an orifice to create additional back pressure to the liquid source. It thus helps balance the flow when multiple plates are connected to a common manifold and have slight pressure imbalances from flow kinematics and gravity. The liquid exits a much larger hole to minimize back pressure within the plate. Note the embosses under dotted lines 139. These embosses are aligned to be over the Center Rails 33. The rails are spot welded to the cold plate through these embosses.

Note the flow is forced down one side of the plate 175 and up the other side 174 (FIG. 15) by a center weld pattern 138 that provides a barrier to fluid "short circuiting" directly from input to output. Further note the center weld is optionally not seam welded but spot welded, thus not fully sealing the barrier. This partially porous center seam thus "leaks" a proportion of the circulating fluid across the barrier, providing improved flow nearby, reducing stagnant fluid buildup.

FIG. 14A is a drawing of the Embossed Cold Plate 120 121 showing the structural details of the embosses. FIG. 14B is a more detailed view of Top Plate 121. The Input and Output Holes on Lower plate 120 are lanced to provide an exterior edge 140. This simplifies manufacturing by self-aligning the pipes during assembly. Each emboss 131 is 0.025 inches deep, the spacing between the top and bottom plates 142 is thus the same distance. This narrow space would restrict the input and output flows near their respective holes. Therefore to minimize this restriction, reverse embosses 135 133 are made to increase the vertical distance at these "pinch" points. The distance between top and bottom plates may be adjusted for various fluid flow and mechanical design constraints, with the optimum range between 0.07 and 0.025 inches, as determined by one skilled in the art.

FIG. 15 is a simulation of the flow rate through the cold plate. The small round white areas are the embosses. The embosses divert and spread the flow over the main active areas of the plate. Areas in the corners 171 and shadowed by embosses e.g. 172 have limited flow. Note the embosses are interdigitated over most of the plate except for areas on the top and bottom of the plate 173, shown in bold dashed lines, where they are used to divide the current across the full half-width of the plate. The interdigitization diverts the flow reducing the size of the shadowed areas behind the embosses. Although very good at moving heat via mass transport, water and most other cooling fluids have poor heat conduction properties. It is therefore important to create turbulence and fluid layer intermixing mixing for good heat transfer from the cold plate interior surface to the cooling fluid. The interdigitization and sloping sides of the embosses create turbulence to reduce the fluid boundary at the plates interior surface and also stir the fluid, intermixing the layers of fluid to draw the heat away from the cold plate surface and transport it away.

The above description assumes the trays are mounted below the cold plate. It is also possible to flip the entire assembly so the cold plate is below the trays. Note in this instance, it differs greatly from the Open Rack installation in that the server is mounted upside down above the cold plate. The advantage in such a scheme is that the weight of the server contributes to the pressure between the server and cold plate rather than subtracting. This reduces the force necessary to compress the TIM. For example, if the server weighs 15 pounds and the desired force across the TIM is 65 pounds, the springs need to apply a force of 90 pounds when the trays are underneath the cold plate, but only 50 pounds when on top. The push-pull design of the levers enables this design variation.

We claim:

1. A system to provide cooling to electronic components, the system comprising:
    a thin cold plate having a thickness substantially less than its width and said thickness also substantially less than its length, said cold plate mounted in a supporting rack, said cold plate comprising:
        a top plate and a substantially flat bottom plate coupled together by a first means to seal said plates and a second means to form a separation between said plates wherein a cavity is formed between said top and said bottom plates through which a cooling fluid flows from an input port to an output port;
    a tray comprising:
        one or more said electronic components,
        one or more heat risers thermally coupled by conduction to said one or more electronic components,
        a tray supporting means;
    a means to move said tray between a first and a second position
        wherein in said first position said one or more heat risers are mechanically separated from said cold plate, and
        wherein in said second position said one or more heat risers are thermally coupled to said cold plate by thermal conduction;
    a coupling and supporting means affixed to said substantially flat bottom plate of said cold plate that couples to said tray supporting means whereby the weight of said tray is substantially supported by said cold plate in both said first position and said second position of said tray;
    whereby said tray can be installed and removed from said coupling and supporting means in said first position, and said one or more electronic components can be cooled in said second position.

2. The system of claim 1, wherein said coupling and supporting means affixed to said substantially flat bottom plate of said cold plate couples to a plurality of tray supporting means on a plurality of trays thereby coupling said plurality of trays to said cold plate.

3. The system of claim 1, wherein said tray has a switch that acts as a control means, said switch engaging said cold plate as it traverses from said first position to said second position wherein said control means permits power to flow to said one or more electronics components only when said one or more electronics components are thermally coupled to said cold plate, thereby preventing excessive power to be drawn by said one or more electronic components until said cold plate is thermally coupled to them.

4. The system of claim 1, wherein said cold plate is one of a multiplicity of cold plates first mounted in an insert, said insert mounted in said rack.

5. The system of claim 1, wherein said input port incorporates a flow control means that regulates the flow to a substantially fixed volumetric rate for said cold plate, wherein said flow control means comprises an orifice in said cold plate.

6. The multiplicity of cold plates of claim 4, wherein said multiplicity of cold plates are connected to a common plumbing apparatus, said plumbing apparatus further providing a flow control means to distribute and regulate the incoming cooling fluid flow amongst said plates, wherein said flow control means is an orifice in each of said cold plates in said multiplicity of cold plates that provides backpressure to said plumbing apparatus, said backpressure substantially balancing said cooling fluid flow among said multiplicity of cold plates.

7. The system of claim 1 wherein said means to move said tray between said first position and said second position comprise springs that translate linear horizontal front-back travel into orthogonal vertical travel.

8. The springs of claim 7 wherein said springs apply a substantially constant force between said cold plate and said electronic component in said second position.

9. The system of claim 1, wherein said coupling and supporting means is affixed by welds to said cold plate wherein said welds are spot welds aligned with embosses in the side of said cold plate obverse from said substantially flat bottom plate.

10. The system of claim 1, wherein at least one of said one or more heat risers is a multi-use heat riser comprising a section that extends under a PC card, said PC card thermally sandwiched between said section and said cold plate by means of a first thermal interface material interposed between said PC card and said cold plate and a second thermal interface material interposed between said PC card and said multi-use heat riser.

11. The system of claim 1, wherein a thermal interface material is attached to said heat riser by a repositionable adhesive tape.

12. The system of claim 1, wherein said coupling and supporting means comprises a structurally strong material such as stainless steel.

13. The system of claim 1, wherein said tray comprises a first section that can move independently of a second section.

14. The system of claim 1, wherein the height of said tray and said cold plate in said first position is less than 48 mm.

15. The system of claim 1, wherein said cavity comprises about one-third of said cold plate thickness.

16. A method to cool tray mounted electronic components comprising:
    a. mount a plurality of electronic components requiring cooling in a tray;
    b. conductively thermally couple a first side of a plurality of heat risers to said plurality of electronic components such that the distal sides of said heat risers are aligned in a substantially common plane;
    c. in a support structure, mount a structurally supportive cold plate having a tray supporting means mounted on a substantially flat surface of said structurally supportive cold plate;
    d. circulate a cooling fluid through said cold plate by connecting it to a fluid source regulated by a flow control means;
    e. attach said tray to said tray supporting means whereby said distal sides of said plurality of heat risers are adjacent to, but not coupled to, said cold plate, said tray supporting means substantially supporting the weight of said tray;
f. optionally insert a thermal interface layer between said cold plate and said distal side of said plurality of heat risers;
g. move said tray towards said cold plate until said distal side of said plurality of heat risers is thermally coupled to said substantially flat surface of said structurally supportive cold plate;

whereby the electronic components are cooled.

* * * * *